United States Patent [19]

Coteus et al.

[11] Patent Number: 5,688,147

[45] Date of Patent: Nov. 18, 1997

[54] INTERCHANGEABLE KEY CARD EDGE CONNECTING

[75] Inventors: Paul William Coteus, Yorktown Heights; Thomas Mario Cipolla, Katonah, both of N.Y.

[73] Assignee: International Business Machines Corporation, Armonk, N.Y.

[21] Appl. No.: 760,728

[22] Filed: Dec. 5, 1996

Related U.S. Application Data

[63] Continuation of Ser. No. 371,631, Jan. 12, 1995, abandoned.

[51] Int. Cl.⁶ ........................................ H01R 13/64
[52] U.S. Cl. ................................ 439/681; 439/633
[58] Field of Search ........................ 439/630–633, 439/680, 681

[56] References Cited

U.S. PATENT DOCUMENTS 3,576,519  4/1971  Jayne ........................... 439/633
4,307,927  12/1981  Mollman ....................... 439/681
5,387,132  2/1995  Sarver et al. ................. 439/633

*Primary Examiner*—Hien Vu
*Attorney, Agent, or Firm*—Daniel P. Morris; Alvin J. Riddles

[57] ABSTRACT

A system of using a rotatable key in the insertion of a conductor bearing card edge into a slotted supporting connector to accommodate a large number of different cards. A rotatable key opening in the slot face of the slotted supporting connector together with a specific card feature accommodating key positioned in the opening are arranged so that the key can be in one of several positions controlled by the opening with the shape of the key providing an interruption to the continuity of the slot at different distances along the slot length. The card has at least one notch in the insertion edge positioned to be at the slot interruption distance for the particular position of the key. A large number of unique distances are achievable with a single key part.

2 Claims, 3 Drawing Sheets

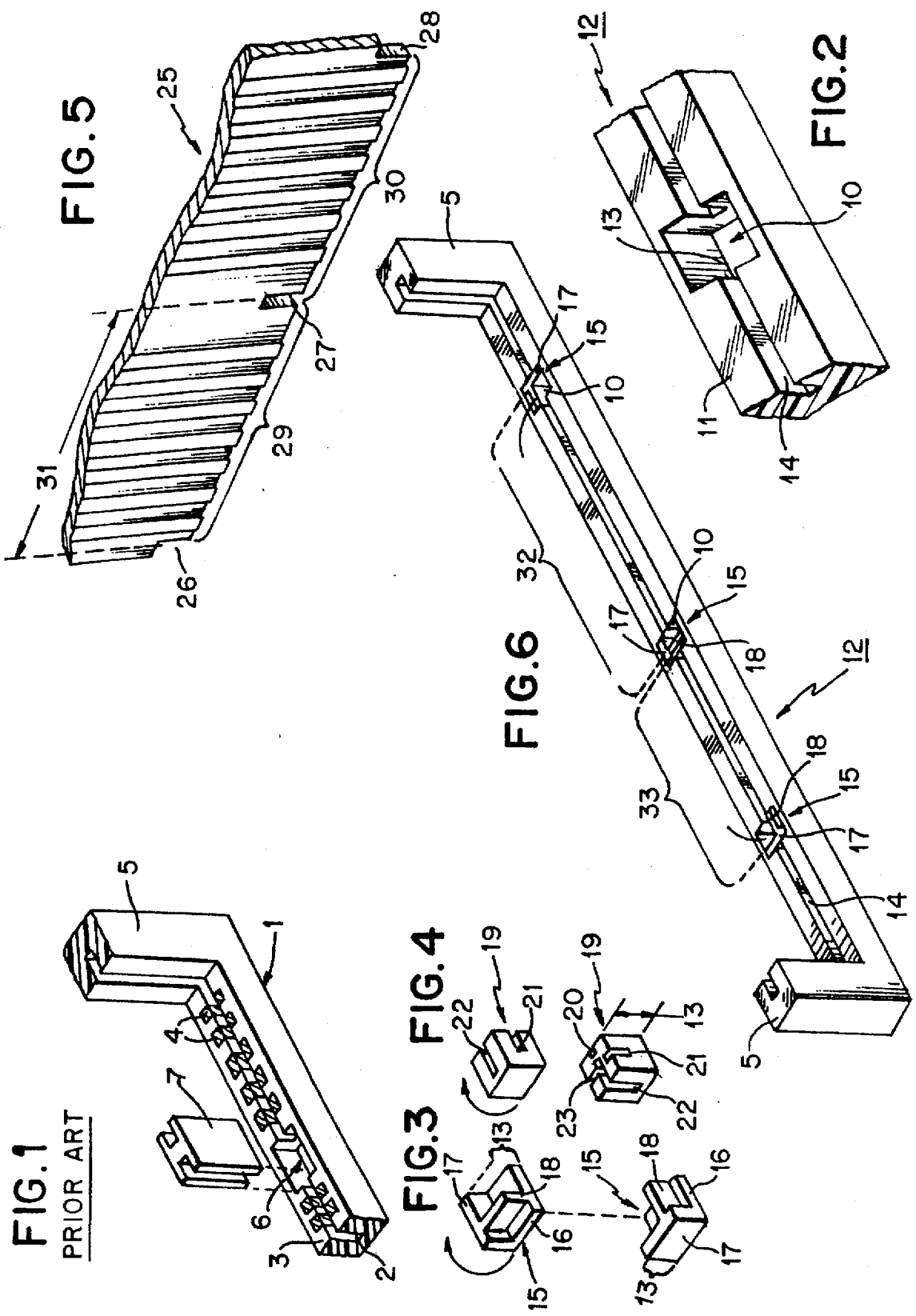

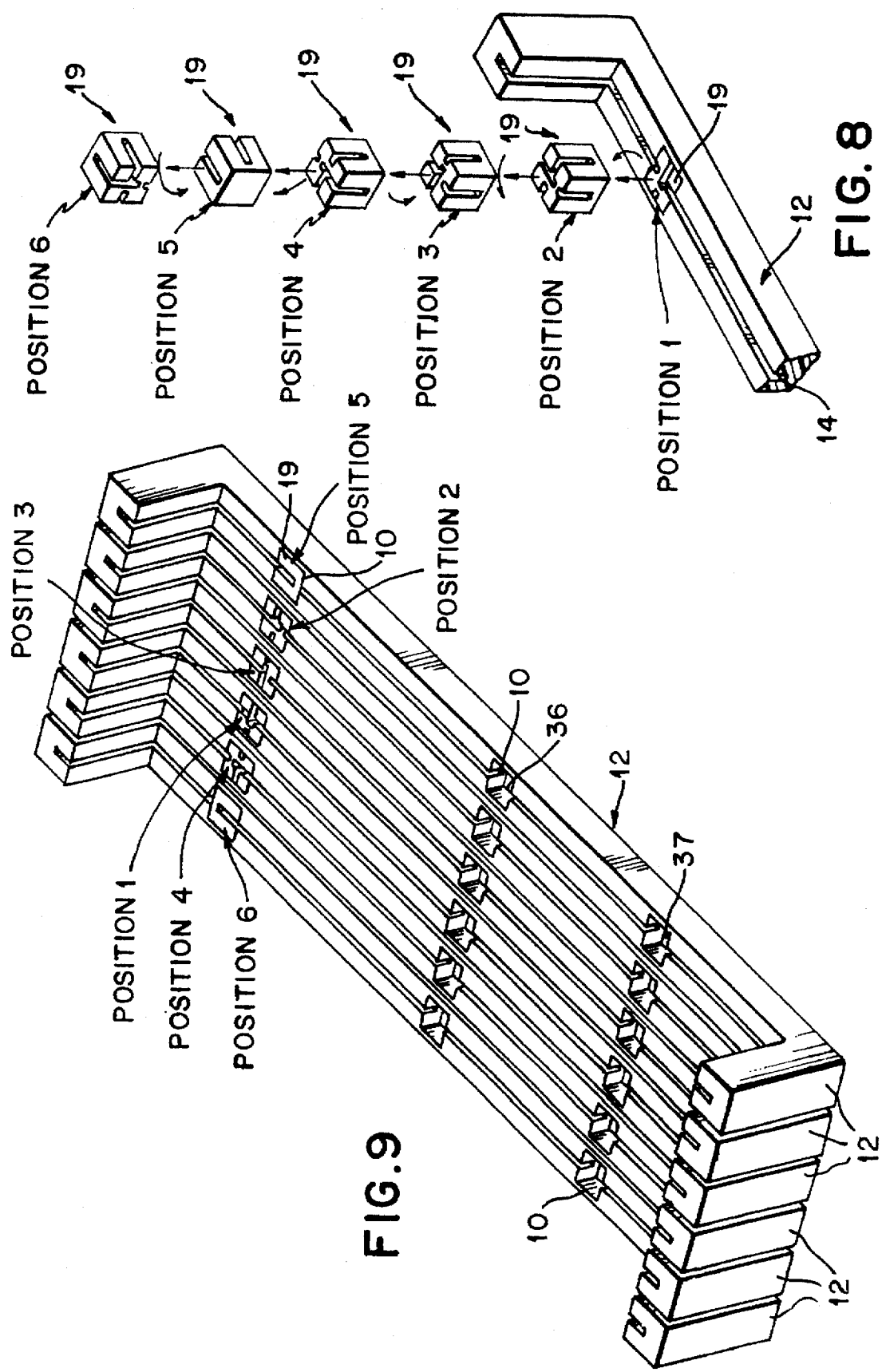

INTERCHANGEABLE KEY CARD EDGE CONNECTING

This application is a continuation of application Ser. No. 08/371,631 filed Jan. 12, 1995 now abandoned.

FIELD OF THE INVENTION

The invention relates to interconnection systems for electronic apparatus and in particular to a keyed card edge connecting system wherein a card edge connector is adapted with interchangeable keying to uniquely accommodate a large number of specific cards.

BACKGROUND OF THE INVENTION AND RELATION TO THE PRIOR ART

In electronic apparatus, a type of interconnecting system heavily used in the art involves the mounting of components such as integrated circuits on insulating printed wiring bearing members having the wiring conductors extending to an edge of the insulating member to serve as contacts to external wiring. The printed wiring bearing members come in various sizes and are generally referred to as cards. In the interconnecting system, the edge of the card with the wiring conductor contacts is positioned in a slot in a supporting connector member with mating external wiring contacts in the slot. The slot in the supporting conductor member has a width and depth relationship to the card to provide support for the card and retains the assembly in electrical contact.

As the electronic art has developed, it has become useful to be able to use the same slotted supporting connector external wiring interconnecting system with a variety of different cards. The use of a key is employed to insure that only a card that is compatible with the external circuitry to which the slotted supporting connector member is connected, can be inserted into the slot. The key is usually an interposer that fits into the slotted supporting connector member, has a unique shape that prevents the conductor edge of any card not compatible with that unique shape from entering the slot. A structure of this type is shown in U.S. Pat. No. 3,566,340.

As the circuit complexity and density in electronic apparatus has increased, it has become beneficial that an ever wider variety of card assemblies be able to be uniquely yet reliably accommodated in slotted supporting connectors.

SUMMARY OF THE INVENTION

The invention is a system of keying the insertion of a conductor bearing card edge into a slotted supporting connector to accommodate a large number of different cards through the providing of a rotatable key opening in the slot face of the slotted supporting connector together with the providing of a specific card feature accommodating key, positioned in the opening. The key and opening are arranged so that the key can be in one of several positions controlled by the correspondence of the shape of the opening with the shape of the key, and with the shape of the key in turn providing an interruption to the continuity of the slot at different lengths along the slot. Cards are provided with at least one edge notch, so positioned in the card insertion edge to be at the slot interruption location for the particular position of the key. A large number of slot lengths are achievable with a single key part. The key and opening combinations are such that, in the preferred embodiment, the key when in position in the opening does not extend above the slot surface of the slotted supporting connector so as to minimize strength reduction and loss of card area both of which in turn enhances the downsizing ability of the connecting system.

BRIEF DESCRIPTION OF THE DRAWINGS

FIG. 1 is a perspective view of a prior art slotted supporting connector and key combination.

FIG. 2 is a perspective view which shows the opening for the invention in a portion of a slotted supporting connector.

FIG. 3 is a perspective view of two positions of an embossed feature rotatable key of the invention.

FIG. 4 is a perspective view of two positions of a slot feature cubic rotatable key of the invention.

FIG. 5 is a perspective view of a card illustrating the use of notches for unique slot lengths.

FIG. 6 is a perspective view of a slotted supporting connector illustrating the use of several, embossed feature rotatable keys, in position, in accordance with the invention.

FIG. 8 is a vertical exploded view of the possible positions in the slotted feature cubic type key rotation.

FIG. 9 is a perspective view of a connecting system assembly of six slotted supporting connector members each with three spaced openings and with a slotted feature cubic key in each of the six positions.

DESCRIPTION OF THE INVENTION

Figure 7:
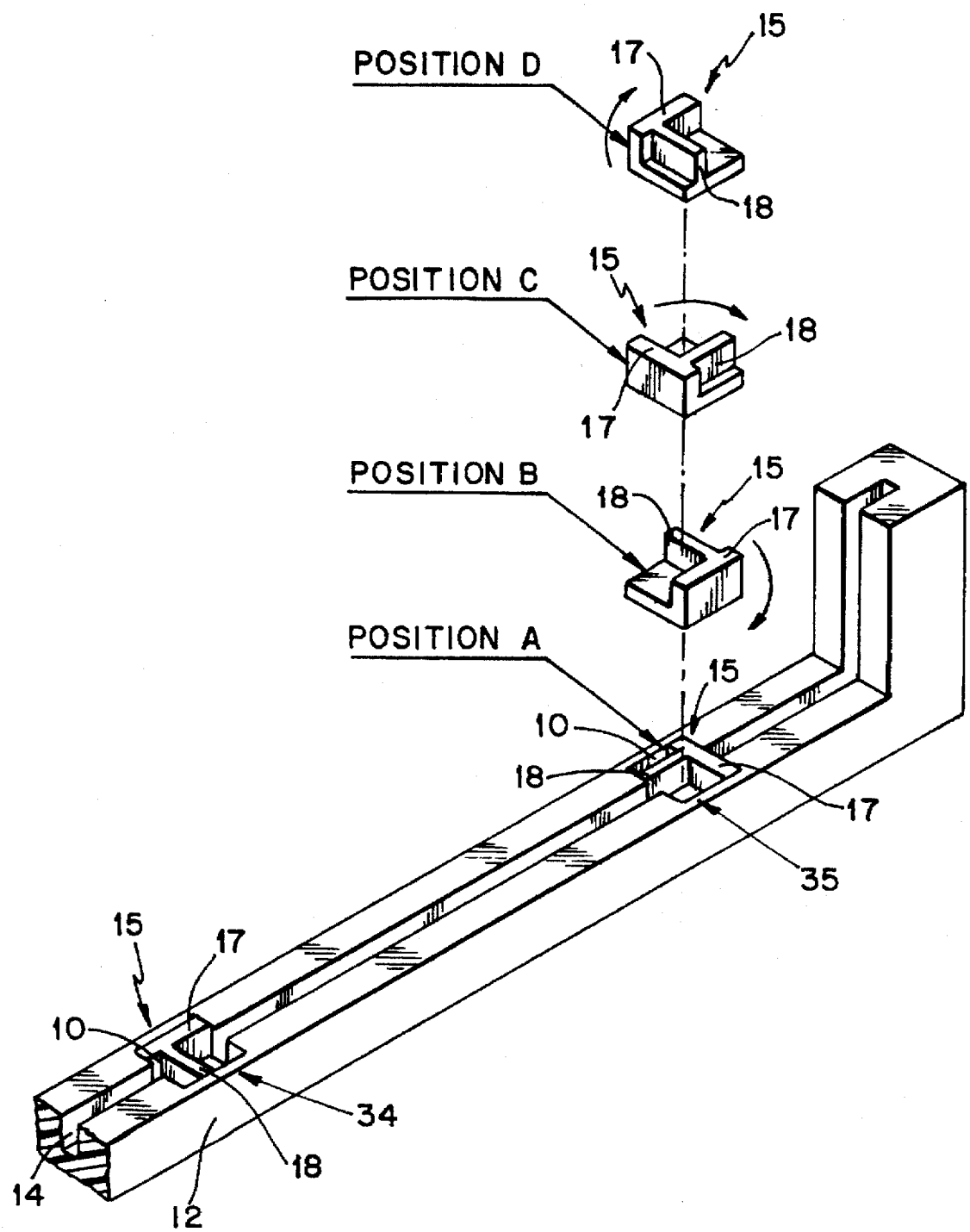
FIG. 7 is a perspective view showing the effect on slot length of the embossed feature type key rotation.

In the electronic apparatus art the printed wiring bearing cards are supported by having their edges with the external contact conductors inserted into the slot of a slotted supporting connector member. A key member, shaped to fit into an opening in the slot face of the slotted supporting connector, is used to insure that an incorrect card cannot be inserted into an incompatible circuitry configuration.

In FIG. 1 there is shown a perspective view of a typical prior art slotted supporting connector and key structure. Referring to FIG. 1, the slotted supporting connector member 1 has a card edge receiving slot 2 running longitudinally in a slot face 3 of the connector 1. The connector member 1 also has a plurality of external wiring connecting conductive members 4 that contact the external contact conductors on the edge of the card, not shown, that is inserted into the slot 2. The slotted supporting connector member 1 in some constructions has a right angle tower portion 5 and the conductive members 4 are extended, not shown, onto the tower portion 5. The friction contact between the members 4 and the conductors at the card edge over the area in the slot 2 provides sufficient and reliable support for the card. In order to insure that only the proper card is insertable into the slot 2, as many key openings as desired are provided, usually equally spaced, in the slot face 3, for a key that will accommodate a particular cutout in a card. In FIG. 1 an example opening 6 is provided into which, in an exploded view, a key 7 is insertable. External wiring is attached to the connecting conductive members 4, out of view in this figure. The slotted supporting connectors 1 are usually retained in a frame with dowels on the underside out of view in this figure. The slotted supporting connector is of insulating material such as a moldable plastic with the plurality of connecting conductive members 4 and with the opening 6 molded into it. The key is also of moldable plastic. The structure of FIG. 1 is available in the art with the opening 6 and the key 7 specifiable, an example being the "SIMM socket" produced by the AMP Corporation in Harrisburgh, Pa. There is however, a need for much greater card variation capability, while retaining the externally wired slotted supporting connector assemblies, than the prior art structure of FIG. 1 will accommodate.

In accordance with the invention, much greater flexibility in uniquely handling a wide variety of cards is achieved by providing an interrelated opening in the slot face of the slotted supporting connector and key shape for the opening with features that interrupt the continuity of the slot at different lengths by the rotational position of the key in the opening in the slot face. A notch is placed in the insertion edge in the card that is positioned at the continuity interruption produced by the key.

The interrelated features are shown in connection with FIGS. 2 through 6. Referring to FIG. 2 there is shown a perspective view of a square example of the rotatable key opening 10 in the slot face 11 of the slotted supporting connector 12. The opening 10 has a depth dimension 13 to accommodate the key and selected to position the uppermost portion of the key at the level of the slot face 11 of the slotted supporting connector 12. The slot itself is labelled element 14.

The key pieces are illustrated in two rotated views each, in FIGS. 3 and 4. The insertion edge of the card is interrupted at different lengths by embossed features or slot features of the key.

Referring to FIG. 3 the embossed feature key 15 has a plane portion 16 with the dimensions of the opening 10 in FIG. 2, a first embossed feature portion 17 along one edge of the portion 16 and with a second embossed portion 18 perpendicular to the first embossed portion 17 and sufficiently off the center of the portion 17 so as not to be in the slot 14 of FIG. 2 when the key 15 is positioned in the opening 10 of FIG. 2 with the portion 17 transverse of the slot 14. The height of the key 15 is essentially the same as the dimension 13 of FIG. 2. When the key 15 is rotated 90 degrees as shown in the portion of FIG. 3 With the rotational indicating arrow, the second portion 18 becomes positioned transverse of the slot 14 with the portion 17 being then positioned parallel to, but to one side of, the slot 14.

Referring to FIG. 4, the slotted feature key 19 is a cube having equal side and depth 13 dimensions, to be compatible with the opening 10 with essentially the same dimensions. The slotted feature key 19 has a different, card edge accommodating slot 20, 21, 22 and 23 in each side face, that extends into one end face, and two of which, 22 and 23 are intersecting. The material of the key 19 remaining between the slots at the end surface serves as slot interruptors in use. The slots stop before reaching the remaining face, leaving material to serve as a slot interruption when the key is on it's side. When the key 19 is rotated into the four positions in the opening 10 of FIG. 2 each of the slots is aligned in one position with the slot 14 of FIG. 2 with the remainder of the key 19 interrupting the slot 14 continuity at a different length. When the key 19 is rotated in the vertical direction or in other words positioned on it's side as shown in the portion of FIG. 4 with the vertical rotational arrow an additional two different slot interruption lengths 21 and 22 become available.

The interrelationship of the card, the key piece or pieces and the slotted supporting connector is shown in connection with FIGS. 5 and 6. Referring to FIGS. 5 and 6 wherein perspective views are shown like reference numerals for like elements are used where appropriate. In FIG. 5 a portion of a card is shown that has notches that separate insertion edge length portions. In FIG. 6 a multi key slotted supporting connector is shown with the rotational position of the keys defining corresponding slot lengths. In FIG. 5 the example portion of a card 25 has example notches 26, 27 and 28 to define unique and different slot lengths 29 and 30. The notches need only be to the insertion depth of the card edge when it is inserted into the slot and need only be to the width of the slot interrupting portions of the key. The notches, of which 26, 27 and 28 are examples, thus do not take up much card area and have minimal effect on the card strength, a benefit of use in the downsizing trend in the art. While, in FIG. 5, a several unique length portion of a card is illustrated, it will be apparent that smaller individual cards such as the portion 31 may be employed in slotted supporting conductors such as element 12.

In FIG. 6, the slotted supporting connector member 12 is provided with, as an example three key openings 10, each with a key 15 positioned therein in a different rotational position. The different rotational positions place, using the key of FIG. 3 as an illustration the portions 17 and 18 transverse of the slot 14, which produces the different slot distances 32 and 33 required for the card edge lengths 29 and 30 respectively between notches 26 and 27, and, 27 and 28 respectively of the example card portion 25 in FIG. 5. The ability to select a wide variety of slot distances is illustrated in greater detail in FIGS. 7-9 for the key types in FIGS. 3 and 4.

Referring to FIG. 7 a perspective view is shown of the effect on slot lengths of the rotational positioning of the key type of FIG. 3. In FIG. 7 a portion of a slotted supporting connector 12 is shown, with two openings 10, and with two keys of the type of FIG. 4, labelled elements 34 and 35, in each opening. The four rotational positions A, B, C and D, available to each key, are shown for visibility, in a single superimposed exploded view above element 35. By rotating the keys with respect to each other, different portions 17 and 18 of each key serve as the transverse boundaries of the available slot length for card edge insertion. As illustrated, the element 35 key is in position A and the element 34 key is in position D. The longest slot length would occur with element 35 in position A and with element 34 in position C whereas the shortest slot length would be with element 35 in position C and with element 34 in position A, and intermediate lengths can be achieved using other combinations of positions.

The slot length flexibility of the invention will be apparent when, referring to FIG. 6, the four positions A, B, C and D of each of the three keys produces a 4×4×4 total or 64 unique card insertion lengths.

The number of available slot lengths increases when a key of the type element 19 of FIG. 4 is used that has 6 rotational positions. In FIG. 8, a vertical exploded view is provided, showing the 6 rotational positions. In FIG. 9 a perspective view of a connecting system is shown having six parallel connecting elements 12, each with three openings 10, and with a key 19 in each of the 6 rotational positions. In the rotation the key places a portion of the key piece transverse of the slot to interrupt the continuity and thereby prevent entry of a card edge that is beyond the correct length. The shortest slot length between two adjacent openings would be to position key 36 in position 5 and key 37 in position 6; whereas the longest slot length would be to have the key 36 be in position 6 and the key 37 be in position 5.

What has been described is a system of keying the insertion of a conductor bearing card edge into a slotted supporting connector so as to accommodate a large number of different cards. The system provides a rotatable key opening in the slot face of the slotted supporting connector and provides a specific card feature accommodating key piece that is positioned in the rotatable key opening.

The key and opening are arranged so that the shape of the key provides an interruption to the continuity of the slot at a specific distances along the slot length corresponding to a specific card edge.

What is claimed is:

1. An electronic card edge connector having an elongated longitudinal slot in a face thereof, into which a conductor bearing edge of a circuit card is to be inserted, said connector further having specific shape openings in said face, at least one substantially rectangular key member, said key member fitting into a respective one of said openings, said key member having a plurality of rotational positions and faces for positioning in one of said openings, and, said key member having in each of said rotational positions a corresponding face with a unique longitudinal slot interruption feature and wherein said unique longitudinal slot interruption feature is the material of said key member bounded by at least one key slot in said key member in each of said faces of said key member, said longitudinal slot interruption features producing a different specific length for said longitudinal slot when said key member is to be positioned in a different rotated position in one of said openings, and, said circuit card having a notch in said conductor bearing edge thereof engaging with a respective corresponding longitudinal slot interrupting feature when said circuit card is positioned in said longitudinal slot.

2. An electronic card edge connector having an elongated longitudinal slot in a face thereof, into which a conductor bearing edge of a circuit card is to be inserted, said connector further having specific shape openings in said face, at least one substantially rectangular key member, said key member fitting into a respective one of said openings, said key member having a plurality of rotational positions and a plurality of embossed longitudinal slot interruption features substantially perpendicular to each other, said key member being positioned in one of said openings, said embossed longitudinal slot interruption features producing a different specific length for said longitudinal slot when said key member is positioned in a different rotated position in one of said openings, and, said circuit card having a notch in said conductor bearing edge thereof engaging with a respective corresponding embossed longitudinal slot interrupting feature when said circuit card is positioned in said longitudinal slot.

* * * * *